United States Patent [19]
Sakuma et al.

[11] Patent Number: 5,978,070
[45] Date of Patent: Nov. 2, 1999

[54] PROJECTION EXPOSURE APPARATUS

[75] Inventors: Shigeru Sakuma, Chigasaki; Tsutomu Mizugaki, Matsudo; Masaki Shiozawa, Sagamihara, all of Japan

[73] Assignee: Nikon Corporation, Tokyo, Japan

[21] Appl. No.: 09/026,507

[22] Filed: Feb. 19, 1998

[51] Int. Cl.[6] .................................................. G03B 27/52
[52] U.S. Cl. ........................................... 355/53; 250/548
[58] Field of Search ................................. 355/53, 67, 71, 355/77; 250/548

[56] References Cited

U.S. PATENT DOCUMENTS

| | | | |
|---|---|---|---|
| 4,922,290 | 5/1990 | Yoshitake et al. | 355/53 |
| 5,028,967 | 7/1991 | Yamada et al. | 359/355 |
| 5,471,278 | 11/1995 | Yasuda et al. | 355/67 |
| 5,679,125 | 10/1997 | Hiraiwa et al. | 65/397 |
| 5,825,043 | 10/1998 | Suwa | 250/548 |

FOREIGN PATENT DOCUMENTS

| | | |
|---|---|---|
| 0338411 A2 | 10/1989 | European Pat. Off. . |
| 828172 | 3/1998 | European Pat. Off. . |
| 4-167421 | 6/1992 | Japan . |
| 9-006009 | 1/1997 | Japan . |
| 9-255328 | 9/1997 | Japan . |
| 9-255329 | 9/1997 | Japan . |
| 9315893 | 12/1997 | Japan . |
| 10-129969 | 1/1998 | Japan . |
| 10001310 | 1/1998 | Japan . |
| 10-079345 | 3/1998 | Japan . |
| 10-59799 | 3/1998 | Japan . |
| 10059799 | 3/1998 | Japan . |

OTHER PUBLICATIONS

European Search Report (Jul. 14, 1998).
P. Feltham and I. Andrews; "Colour Centres in Alkaline Earth Fluorides"; Phys. Stat. Sol. 10,203 (1965); pp. 203–211.

Primary Examiner—D. Rutledge
Attorney, Agent, or Firm—Morgan, Lewis & Bockius LLP

[57] ABSTRACT

A projection exposure apparatus capable of projecting and exposing mask pattern images onto a substrate by means of a optical projection system, the apparatus includes an optical illumination system capable of illuminating a mask utilizing an excimer laser illuminating light source in a wavelength range of 230 nm or less, and an optical projection system including optical members that include a calcium fluoride crystal with a total alkaline earth metal impurity content of $1 \times 10^{18}$ atom/cm$^3$ or less, and which projects images of the mask pattern onto a substrate. The calcium fluoride crystal is manufactured by a method including the steps of adding a fluorinating agent to a powdered calcium fluoride forming a mixture, placing the mixture in a growing crucible inside a vacuum furnace, and evacuating the vacuum furnace. Once the vacuum furnace is evacuated, the temperature is elevated a first time inside the vacuum furnace to a temperature exceeding a melting point of the mixture and is maintained at a predetermined constant temperature inside the vacuum furnace until a polycrystalline material is formed. The polycrystalline material is then cooled and the temperature inside the vacuum furnace is elevated until the polycrystalline material is melted, wherein crystal growth of the polycrystalline material is promoted and a crystal ingot is formed.

9 Claims, 1 Drawing Sheet

PROJECTION EXPOSURE APPARATUS

This application hereby incorporates by reference U.S. Pat. No. 5,679,125, filed Jul. 5, 1995 and Japanese Application No. 8-218291, filed Aug. 20, 1996.

BACKGROUND OF THE INVENTION

1. Field of the Invention

The present invention relates to a projection exposure apparatus that includes an excimer laser as a light source operating in a light wavelength range of 230 nm or less, using a calcium fluoride crystal as an optical material.

2. Discussion of the Related Art

In recent years very-large-scale-integrations (VLSIs) have shown increasingly higher degrees of integration and function so that additional techniques for precision silicon integration on wafers has been required. Typical methods of producing VLSIs and similar devices are generally based on photolithography. For instance a DRAM, a VLSIs circuit with a capacity of 256 M-bits or greater, have been realized in recent years. As more and more integrated circuits are placed on a substrate the line widths separating each IC has become smaller, i.e., 0.35 microns or less. Accordingly, high imaging performance (including resolution and focal depth) is required in projection lenses used in steppers, which are at the cutting edge of photolithographic techniques. In response to these requirements, exposure wavelengths have become shorter and steppers using a KrF excimer laser light source operating at a light wavelength of 248 nm, have begun to appear on the market. There are extremely few optical materials that can be used in photolithography at wavelengths of 248 nm or less. Fluorite (calcium fluoride crystals) and synthetic silica glass are the typically used materials in such cases.

Furthermore, steppers using an ArF excimer laser light source operating at a wavelength of 193 nm have been proposed as the next generation of steppers and are viewed as a technological extension of the KrF excimer lasers. Moreover, light sources with even shorter wavelengths, such as $F_2$ lasers as the light source, have been proposed.

Various problems have been encountered in the transition from the KrF excimer lasers to the ArF excimer lasers. In particular, calcium fluoride crystals, which exhibit almost no change in internal transmissivity when exposed to the KrF excimer laser light source, begin to exhibit a drop in internal transmissivity when exposed to an ArF excimer laser light source.

Accordingly, research has been directed towards perfecting a projection exposure apparatus using an excimer laser light source in the 230 nm or less wavelength range as a photolithographic light source.

The present invention relates to a projection exposure apparatus which uses an excimer laser in the 230 nm or less wavelength range as an illuminating light source employing a calcium fluoride crystal with a total alkaline earth metal impurity content of $1 \times 10^{18}$ atom/cm$^3$ or less as an optical material, which results in a projection exposure apparatus with a superior exposure treatment capacity, i.e., through-put. The term through-put as used here is defined as the amount of treatment, number of wafers treated, per unit time.

SUMMARY OF THE INVENTION

Accordingly, the present invention is directed to a projection exposure apparatus that substantially obviates one or more of the problems due to limitations and disadvantages of the related art.

An object of the present invention is to provide a projection exposure apparatus employing an excimer laser illuminating light source operating in the source light wavelength range of 230 nm or less.

Another object of the present invention is to provide a projection exposure apparatus with an excimer laser illuminating light source operating in the source light wavelength range of 230 nm or less employing a calcium fluoride crystal.

A further object of the present invention is to provide a method for manufacturing a calcium fluoride single-crystal ingot.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawing.

To achieve these and other advantages and in accordance with the purpose of the present invention, as embodied and broadly described, the projection exposure apparatus projects and exposes mask pattern images onto a substrate by means of an optical projection system, the projection exposure apparatus includes an optical illumination system capable of illuminating a mask utilizing an excimer laser illuminating light source in a wavelength range of 230 nm or less and an optical projection system including optical members that include a calcium fluoride crystal with a total alkaline earth metal impurity content of $1 \times 10^{18}$ atom/cm$^3$ or less, capable of projecting images of the mask pattern onto to a substrate.

In another aspect of the projection exposure apparatus the projection exposure apparatus projects and exposes mask pattern images onto a substrate by means of an optical projection system, the exposure apparatus includes an optical illumination system including optical members that include a calcium fluoride crystal with a total alkaline earth metal impurity content of $1 \times 10^{18}$ atom/cm$^3$ or less, capable of exposing a mask with an excimer laser light source operating in a light wavelength range of 230 nm or less, and an optical projection system capable of projecting the mask pattern images onto the substrate.

In a further aspect of the projection exposure apparatus a method for manufacturing a calcium fluoride single-crystal ingot is disclosed, the manufacturing method for a calcium fluoride crystal includes the steps of adding a fluorinating agent to powdered calcium fluoride forming a mixture, placing the mixture in a growing crucible inside a vacuum furnace, evacuating the vacuum furnace, elevating a temperature a first time inside the vacuum furnace to a temperature exceeding a melting point of the mixture, maintaining a predetermined constant temperature inside the vacuum furnace forming a polycrystalline material, cooling the polycrystalline material, elevating the temperature inside the vacuum furnace melting the polycrystalline material, wherein crystal growth of the polycrystalline material is promoted, and forming a crystal ingot.

It is to be understood that both the foregoing general description and the following detailed description are exemplary and explanatory and are intended to provide further explanation of the invention as claimed.

BRIEF DESCRIPTION OF THE DRAWINGS

The accompanying drawing, which is included to provide a further understanding of the invention and is incorporated in and constitutes a part of this specification, illustrates embodiments of the invention and together with the description serves to explain the principles of the invention. In the drawing.

DETAILED DESCRIPTION OF THE PREFERRED EMBODIMENTS

Figure 1:
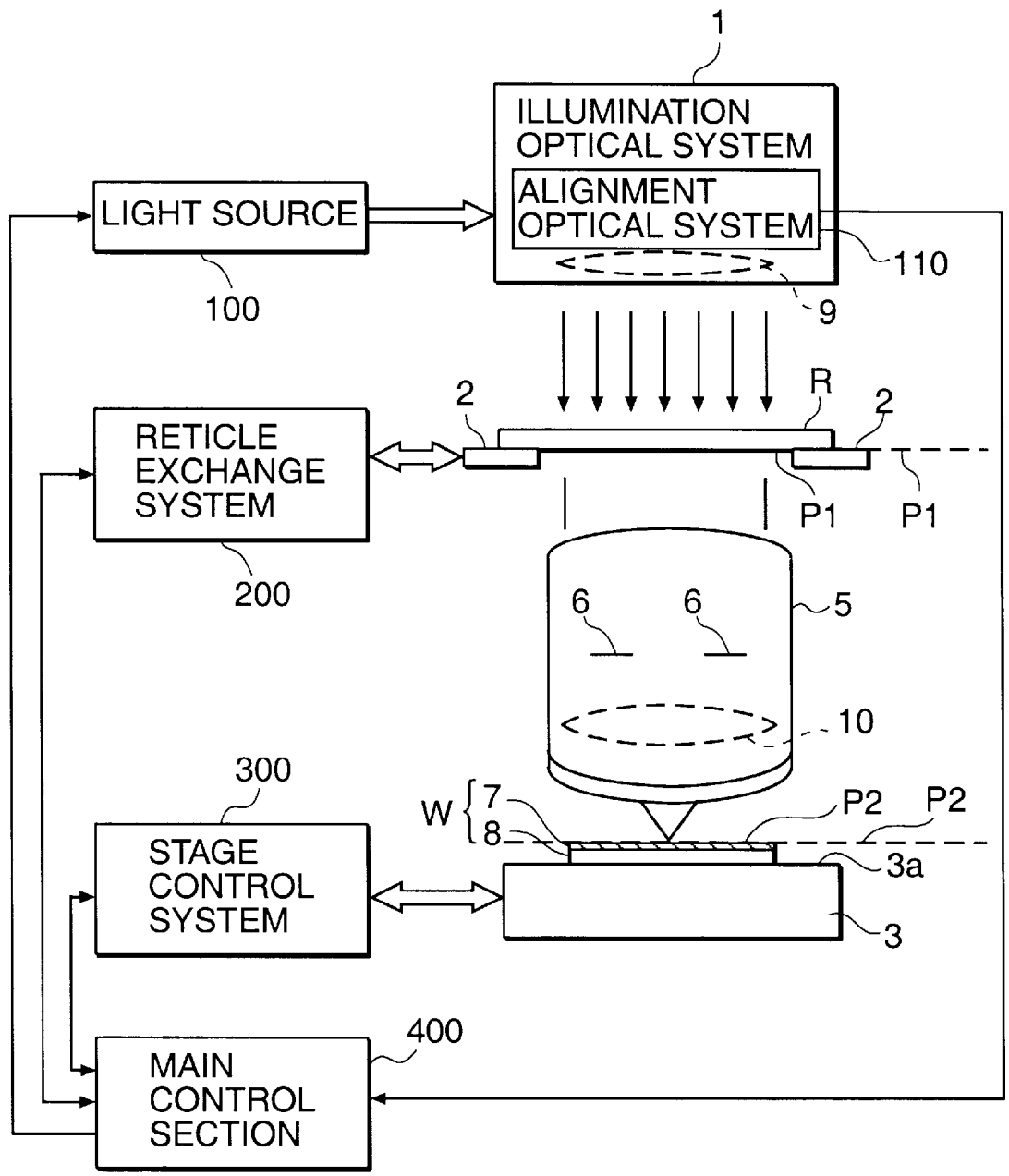
FIG. 1 is a schematic diagram of the optical system of the stepper of the present invention.

Reference will now be made in detail to the preferred embodiments of the present invention, examples of which are illustrated in the accompanying drawing.

There are three factors which cause a drop in optical transmissivity. They are optical reflection, optical scattering and optical absorption. Two of these phenomena, optical scattering and optical absorption, occur in the interior portions of optical materials. Although optical scattering is undesirable, as it decreases contrast, the affect of optical scattering on optical performance is small as compared to the effect of optical absorption on optical performance. Optical absorption creates an increase in the temperature of the optical material, thus altering the refractive index so that there is a conspicuous drop in resolution.

The presence of impurities in the raw materials prohibits the perfect formation of crystals, such as calcium fluoride, thereby decreasing optical transmissivity by increasing absorption. Therefore, a complete absence of impurities is desirable, but realistically, such an absence of impurities is impossible. For alkaline earth metals from the same chemical group as calcium, purification by separation of the raw materials is especially difficult. Furthermore, the technique of removing impurities by crystal growth is also difficult. As a result of the difficulties of removing the impurities from the raw materials, calcium fluoride crystals appearing on the market contain large quantities of alkaline earth metal impurities.

In conventional optical materials, it has been discovered that the presence of alkaline earth metal impurities causes absolutely no problems in terms of the initial transmissivity. However, when calcium fluoride is irradiated with an excimer laser at a wavelength of 230 nm or less (e.g., an ArF excimer laser or a $F_2$ excimer laser), color centers are formed due to the impurities. The optical absorption bands created by the color centers do not always have peaks at the wavelength of the light source used. Since the optical absorption bands are not very steep, they have an effect on the transmissivity at the wavelength used. Furthermore, the concentration of the color centers exhibit a linear relationship with the optical absorption coefficient at the wavelength utilized. The color center concentration is related to the concentration of impurities, (typical of alkaline earth metals), and to the energy density of the light source utilized.

Thus, it is important to select a calcium fluoride crystal that has an appropriate concentration of impurities in accordance with the design of the exposure projection apparatus.

In conventional calcium fluoride crystals, the presence of strontium in large quantities, exceeding $1 \times 10^{18}$ atom/cm$^3$, has been discovered. It is especially important to use a calcium fluoride crystal with a lowered strontium content.

A lower strontium calcium fluoride crystal can be manufactured by a crystal growth method known as the "Bridgeman Method." In this method, calcium fluoride, artificially produced by chemical synthesis, is used as the raw material. Commonly used methods to synthesize the calcium fluoride are: (1) reacting calcium carbonate with ammonium fluoride or ammonium hydrogenfluoride; (2) adding excess hydrofluoric acid to calcium carbonate and heating or reacting aqueous solutions of calcium chloride and potassium fluoride; and (3) melting a mixture consisting of calcium chloride, an alkali metal fluoride, and an alkali metal chloride. Using the calcium fluoride thus synthesized and purified as a raw material, the raw material is packed into a growing crucible together with a fluorinating agent, such as $PbF_2$, placed in a vacuum electric furnace (growing apparatus), and maintained at a vacuum of $10^{-5}$ to $10^{-6}$ Torr. The temperature inside the crystal growing apparatus is then gradually elevated to react the calcium fluoride raw material and the fluorinating agent. The temperature is then gradually elevated to exceed the melting point of the calcium fluoride (1370° C. to 1450° C.), volatilizing the excess fluorinating agent and reaction product until the raw material is melted. During the crystal growth stage, the growing crucible is lowered at the rate of approximately 0.1 to 5 mm/H, so that crystallization is promoted and proceeds from the lower portion of the growing crucible, thus producing a calcium fluoride crystal.

In conventional methods for manufacturing calcium fluoride crystals, numerous problems have been encountered. For instance, alkaline earth metal impurities will be present in the raw-material powder, such as magnesium, strontium, and barium, belonging to the same chemical group as calcium, and are not removed by purification and remain intact in the product.

Since magnesium, strontium, and barium belong to the same chemical group as calcium and have similar properties, such impurities are present at concentrations of several ppm or greater in the synthesized powdered-form calcium fluoride, with strontium in particular being present at a concentration of approximately 200 ppm. Even if the crystal growth method is performed using the powdered-form raw material, the impurities remain in spite of the application of the conventional methods.

According to W. BOLLMAN, Crystal Research and Technology, 16, 521 (1981), which is hereby incorporated by reference, segregation coefficients for these three types of impurities are as follows: 0.15 for magnesium, 0.705 for strontium, and 0.18 for barium. The definition of segregation coefficient is as follows:

$$k_0 = c(s)/c(l)$$

Here, $k_0$ is the segregation coefficient, c(s) is the impurity concentration in the solid phase and c(l) is the impurity concentration in the liquid phase. If the solid phase and the liquid phase are in a state of equilibrium, crystal growth always proceeds according to this formula. If the Bridgeman Method is employed, the impurity concentration decreases with crystal growth if the segregation coefficient $k_0 > 1$, but conversely impurity concentration increases with crystal growth if $k_0 < 1$. If $k_0$ is approximately 0, then impurities are removed with crystal growth. Accordingly, such a segregation coefficient level is very desirable.

Magnesium and barium both exhibit a segregation coefficient $k_0$ of less than 0.2 that is small compared to that of strontium. However, this coefficient acquires added significance when crystal growth is performed with an equilibrium state maintained between the solid phase and the liquid phase. If the growth rate is large, the equilibrium relationship between the liquid and solid phases cannot be maintained. Conventionally, as the diameter of the crystal increases the effect of convection currents (spontaneous convection and surface tension convection) increases, so that it becomes extremely difficult if not impossible to maintain a state of equilibrium.

In order to realize a state of equilibrium, it has been necessary to devise a means for minimizing the crystal growth rate and suppressing convection in the liquid phase to the maximum extent possible. In order to accomplish this, the crystal growth rate is lowered and the time required for manufacture is increased, resulting in increased production cost. Therefore, it may be said that a growth rate of approximately 0.3 mm/H is the lower limit based on a cost-benefit analysis.

The construction of the vacuum electric furnace is extremely important for preventing convection in the liquid phase. A crystal growing apparatus that has a heater in its upper portion, and which has a structure that suppresses convection, is utilized. As the crystal growth progresses, the degree to which the system is cooled to form the crystallized solid phase increases. As crystal growth occurs, the outputs of the heater in the upper portion and the heater in the ceiling area of the furnace are gradually increased.

Thus, if crystal growth is performed wherein the segregation coefficient $k_0$ is significant, the impurities, other than strontium, i.e., magnesium and barium, can be removed in the growth process so that almost no impurities, other than strontium, remain in the main portion of the crystal ingot. With respect to strontium, a calcium fluoride crystal with a low impurity content can be obtained by removing the portion grown in the latter half of the crystal growth process and performing crystal growth again, or by cutting the calcium fluoride crystal from the crystal portion grown in the initial stages of growth.

Sufficient removal of impurities in the stage prior to crystal growth has been considered, but the purification from the raw material powder form is extremely expensive. Although low alkaline earth metal concentrations as the raw material in powder form would be ideal, such low concentrations are not essential and raw materials with common purity levels may be used.

By way of example, the calcium fluoride crystal used in the present invention may be manufactured by a method that includes the processes as described below.

First a single-crystal ingot is produced by heating and melting a polycrystalline material and is caused to undergo crystal growth. Lower portions (in the direction of growth) of several single-crystal ingots, obtained by performing the above process multiple times, are cut off and removed. The lower portions of the several single-crystal ingots cut off are put into the same crucible, heated, and melted, and are caused to undergo crystal growth again so that a single-crystal ingot is produced. Therefore, it is possible to obtain a calcium fluoride crystal in which the total alkaline earth metal impurity content is $1 \times 10^{18}$ atom/cm$^3$ or less.

The exposure apparatus of the present invention will now be described in detail.

The apparatus of the present invention is a projection exposure apparatus of the type known as a stepper that is used to project the image of a reticle (mask) pattern onto a wafer (substrate) which is coated with a photo-resist material. For a general discussion of exposure apparatuses see U.S. patent application Ser. No. 08/667,606, filed Jun. 21, 1996, and its corresponding Japanese Patent Application, 7-157812, which are hereby incorporated by reference.

FIG. 1 shows one example of the basic structure of the projection exposure apparatus of the present invention. The projection exposure apparatus, as shown in FIG. 1, includes a wafer stage 3 on whose surface 3a a wafer W, coated with a photo-sensitive agent, is placed, an optical illumination system 1 is used to transfer a prepared mask pattern (reticle R) onto the wafer W by irradiation (in a vacuum) with ultraviolet light of a specified wavelength prepared as an exposing light, a light source 100 that supplies exposing light to the optical illumination system 1, and an optical projection system 5 positioned between an initial surface P1 (objective surface) on which the mask R is installed and a second surface (image surface) that coincides with the surface of the substrate W that is used to project an image of the pattern of the mask R onto the substrate W. The optical system 1 includes an optical alignment system 110 used to adjust the relative positions of the mask R and wafer W. The mask R is installed on a reticle stage 2 capable of moving parallel to the wafer stage 3. The reticle exchange system 200 exchanges and transports reticles (masks R) that are set on the reticle stage 2. The reticle exchange system 200 includes a stage driver to move the reticle stage 2 parallel to the surface 3a of the wafer stage 3. The optical projection system 5 includes an optical alignment system used in a scan-type projection exposure apparatus.

The projection exposure apparatus of the present invention is capable of being applied to a scan-type exposure apparatus, wherein the mask and substrate are caused to move in synchronization and the mask pattern is exposed. Additionally, the apparatus of the present invention is capable of being used in a step-and-repeat-type exposure apparatus in which the mask pattern is exposed with the mask and substrate in a stationary state and the substrate is moved in successive steps.

The projection exposure apparatus of the present invention uses a calcium fluoride crystal material of the type described above, wherein the total alkaline earth metal impurity content is $1 \times 10^{18}$ atom/cm$^3$ or less as the material of the optical members. In a preferred embodiment, the projection exposure apparatus of the present invention, as shown in FIG. 1, uses a calcium fluoride crystal material in the optical lens 9 of the optical illumination system 1 and/or the optical lens 10 of the optical projection system.

As a result of using calcium fluoride (which has a superior initial transmissivity and shows little drop in transmissivity during light irradiation, as described above) as the material of the optical members, the projection exposure apparatus of the present invention is capable of achieving an improvement in the exposure treatment capacity, through-put, as compared to conventional projection exposure apparatuses.

Manufacture of Calcium Fluoride Single Crystal

A small amount of a fluorinating agent was added to 50 kg of a commercially marketed powdered calcium fluoride raw material. The mixture was placed in a carbon vessel and was set inside a vacuum electric furnace. After the interior of the furnace was evacuated to a vacuum of $10^{-5}$ Torr or less, the temperature was elevated and maintained at a value exceeding the melting point, i.e., a temperature of 1370° to 1450° C., for one day and the heating source was removed. The once-melted polycrystalline material was then caused to undergo crystal growth inside the vacuum electric furnace. The temperature was elevated to a value of 1370° to 1420° C., so that the polycrystalline material was again melted, the growing crucible was then drawn downwardly at an extremely slow rate.

When the distribution of the concentrations of alkaline earth metals (Mg, Sr, Ba) in the direction of crystal growth of the crystal ingot ($\phi 250 \times t300$) thus obtained was measured, Mg and Ba were present only in trace amounts. However, Sr showed a higher concentration towards the top, i.e., in the direction of growth, of the crystal ingot. Two calcium fluoride crystals cut from the crystal ingot are used as Comparative Examples 1 and 2.

Crystal ingot growth by the above method was performed three times. The three crystal ingots thus obtained were cut at a point 100 mm from the bottom of the crystal ingot just grown and the lower portions only were packed into a growing crucible and caused to undergo crystal growth again. The same operation was repeated so that farther impurities in the crystal ingot were removed a total of three times.

The three calcium fluoride crystals cut from the crystal ingots obtained by the above process were used as Practical Example 1, Practical Example 2, and Practical Example 3. Analysis values (obtained by ICP-AES) for the alkaline earth metals (Mg, Sr, Ba) in the calcium fluoride crystals of Comparative Examples 1 and 2 and the calcium fluoride crystals of Practical Examples 1 through 3 are compared in Table 1.

TABLE 1

(Analysis values for alkaline earth metal impurities in calcium fluoride crystals)

| Sample No. | Mg | Sr | Ba [ppm] |
|---|---|---|---|
| Comparative Example 1 | 17 | 170 | 5 |
| Comparative Example 2 | 15 | 140 | 4 |
| Practical Example 1 | 3 | 20 | 2 |
| Practical Example 2 | 5 | 7 | 1 |
| Practical Example 3 | <1 | 2 | <1 |

Measurement method: ICP-AES (inductively coupled plasma - atomic emission spectroscopy)

The lower-limit value of analysis was 1 ppm. When the total atomic concentrations were calculated, the concentration for the calcium fluoride crystal of Comparative Example 1 was $5.1 \times 10^{18}$ atom/cm$^3$, the concentration for Comparative Example 2 was $4.3 \times 10^{18}$ atom/cm$^3$, and the concentrations for the calcium fluoride crystals of Practical Examples 1 through 3 were $7.1 \times 10^{17}$, $5.5 \times 10^{17}$ and $1.3 \times 10^{17}$, atom/cm$^3$, respectively.

The results obtained, when the initial transmissivity values (10-mm internal transmissivity prior to irradiation with light) of the above calcium fluoride crystals were measured and tabulated, are presented in Table 2.

TABLE 2

(10-mm internal transmissivity at 193 nm light wavelength)

| Sample No. | Internal Transmissivity [%] |
|---|---|
| Comparative Example 1 | 99.8 |
| Comparative Example 2 | 99.9 |
| Practical Example 1 | 99.9 |
| Practical Example 2 | 99.8 |
| Practical Example 3 | 99.9 |

As is shown in Table 2, alkaline earth metals did not greatly affect initial transmissivity.

φ30×t10 samples were cut from the respective single crystals and the surfaces of these samples were polished. The transmissivity, including reflection loss, with a sample thickness of 10 mm at 193 nm light wavelength following irradiation with $10^4$ shots of an ArF excimer laser at a prescribed energy density, was measured in a nitrogen atmosphere using a Cary 5 measurement device manufactured by Varian. The results obtained along with irradiation conditions are shown in Table 3.

TABLE 3

(Results of ArF excimer laser damage test)

| | Energy Density [mJ/cm$^2$-pulse] | | | |
|---|---|---|---|---|
| Sample No. | 100 | 50 | 25 | 13 |
| Comparative Example 1 | 5.3 | 2.0 | 0.8 | 0.5 |
| Comparative Example 2 | 4.7 | 2.1 | 0.9 | 0.4 |
| Practical Example 1 | 0.5 | 0.2 | <0.1 | <0.1 |
| Practical Example 2 | 0.6 | 0.3 | <0.1 | <0.1 |
| Practical Example 3 | 0.3 | 0.2 | <0.1 | <0.1 |

Sample thickness: 10 mm; number of irradiating pulses: $10^4$ pulses.

The affects of energy density with respect to impurity atom concentration on the drop in transmissivity are evident from this table. The energy density refers to the amount of energy per unit area per pulse irradiating the optical material.

Manufacture of Projection Exposure Apparatus

Projection exposure apparatuses were assembled using the calcium fluoride crystals of Practical Example 1 and Comparative Example 1 as the materials of the optical members. A schematic diagram of the type of projection exposure apparatus used in the present invention is shown in FIG. 1.

As viewed from the light source side, the optical illumination system includes a beam shaping optical system, a first relay optical system, an optical integrator, a second relay optical system, and a condenser optical system. The two lenses of the first relay optical system are made of a calcium fluoride crystal.

Such an optical illumination system is disclosed as Embodiment 1 of U.S. patent application Ser. No. 08/667,606, filed Jun. 21, 1996.

The optical projection system consists of six lens groups and is constructed from 22 lenses made of synthetic silica glass and 7 lenses made of calcium fluoride crystals. The optical system also includes a reducing magnification. Such a optical projection system is disclosed as Embodiment 1 of European Patent 97114588.3, filed Aug. 22, 1997 and its corresponding Japanese Patent Application No. 8-255505, which are hereby incorporated by reference.

The through-put obtained, for the calcium fluoride crystal lenses in the above-described optical projection apparatus made of the material of Comparative Example 1, was compared with the through-put obtained for the lenses made of the material of Practical Example 1. The Practical Example 1 material exhibited an approximately ten-fold increase in through-put as compared to the material of Practical Example 1. The term through-put as used here is defined as the amount of treatment, number of wafers treated, per unit time.

Thus, in the present invention, as a result of the use of a calcium fluoride crystal, with superior durability, as the material for the optical members, the energy density at which the wafers are irradiated is increased so that the exposure time required to make patterns onto the wafers is shortened. As a result, the through-put is greatly increased.

In the practical examples described above, a calcium fluoride crystal with a total alkaline earth metal impurity content of $1 \times 10^{18}$ atom/cm$^3$ or less was used in both the optical projection system and the optical illumination system. However, it should be noted that a similar affect is capable of being obtained even if a calcium fluoride crystal is used in only one of either the optical projection system or the optical illumination system.

It will be apparent to those skilled in the art that various modifications and variations can be made in the projection exposure apparatus of the present invention without departing from the spirit or scope of the invention. Thus, it is intended that the present invention cover the modifications and variations of this invention provided they come within the scope of the appended claims and their equivalents.

What is claimed is:

1. A projection exposure apparatus capable of projecting and exposing mask pattern images onto a substrate by means of an optical projection system, the projection exposure apparatus comprising:

an optical illumination system capable of illuminating a mask utilizing an excimer laser illuminating light source in a wavelength range of 230 nm or less; and an optical projection system including optical members that include a calcium fluoride crystal with a total alkaline earth metal impurity content of $1 \times 10^{18}$ atom/cm$^3$ or less capable of projecting images of the mask pattern onto to a substrate.

2. The projection exposure apparatus according to claim 1, wherein the excimer laser illuminating light source is an ArF excimer laser.

3. The projection exposure apparatus according to claim 2, wherein the optical illumination system includes optical members that include a calcium fluoride crystal with a total alkaline earth metal impurity content of $1 \times 10^{18}$ atom/cm$^3$ or less.

4. The projection exposure apparatus according to claim 1, wherein the excimer laser illuminating light source is a $F_2$ excimer laser.

5. The projection exposure apparatus according to claim 4, wherein the optical illumination system includes optical members that include a calcium fluoride crystal with a total alkaline earth metal impurity content of $1 \times 10^{18}$ atom/cm$^3$ or less.

6. The projection exposure apparatus according to claim 1, wherein the optical illumination system includes optical members that include a calcium fluoride crystal with a total alkaline earth metal impurity content of $1 \times 10^{18}$ atom/cm$^3$ or less.

7. A projection exposure apparatus capable of projecting and exposing mask pattern images onto a substrate by means of an optical projection system, the projection exposure apparatus comprising:

an optical illumination system including optical members that include a calcium fluoride crystal with a total alkaline earth metal impurity content of $1 \times 10^{18}$ atom/cm$^3$ or less, capable of exposing a mask with an excimer laser exposure light source in a wavelength range of 230 nm or less; and an optical projection system capable of projecting the mask pattern images onto the substrate.

8. The projection exposure apparatus according to claim 7, wherein the excimer laser light source is an ArF excimer laser.

9. The projection exposure apparatus according to claim 7, wherein the excimer laser light source is a $F_2$ excimer laser.

* * * * *